United States Patent
Kawai

(10) Patent No.: US 6,750,123 B2
(45) Date of Patent: Jun. 15, 2004

(54) METHOD OF MANUFACTURING CMOS DEVICE WITH IMPLANTATION SHIELDING LAYER

(75) Inventor: Yasuaki Kawai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/847,288

(22) Filed: May 3, 2001

(65) Prior Publication Data

US 2002/0001927 A1 Jan. 3, 2002

(30) Foreign Application Priority Data

Jun. 22, 2000 (JP) .......................................... 2000-187143

(51) Int. Cl.$^7$ ............................................. H01L 21/425
(52) U.S. Cl. .......................... 438/525; 438/306; 438/689
(58) Field of Search ................................. 438/525, 689, 438/306

(56) References Cited

U.S. PATENT DOCUMENTS

| | | | | |
|---|---|---|---|---|
| 4,987,093 A | * | 1/1991 | Teng et al. ................... 438/450 |
| 5,344,787 A | * | 9/1994 | Nagalingham et al. ........ 437/35 |
| 5,374,566 A | * | 12/1994 | Iranmanesh ................... 437/31 |
| 5,841,171 A | | 11/1998 | Iwamatsu et al. |
| 5,913,136 A | * | 6/1999 | Deleonibus ................... 438/586 |
| 5,998,274 A | * | 12/1999 | Akram et al. ................. 438/306 |
| 6,096,583 A | * | 8/2000 | Iwamatsu et al. ............. 438/149 |
| 6,114,258 A | | 9/2000 | Miner et al. .................. 438/787 |
| 6,165,881 A | * | 12/2000 | Tao et al. ..................... 438/592 |
| 6,331,456 B1 | * | 12/2001 | Wu ............................... 438/154 |
| 6,340,556 B1 | * | 1/2002 | Wong ............................ 430/296 |
| 6,383,861 B1 | | 5/2002 | Gonzalez et al. ............. 438/241 |
| 6,492,712 B1 | | 12/2002 | Chen et al. ................... 257/632 |
| 2001/0019155 A1 | * | 9/2001 | Warashina et al. ........... 257/351 |

FOREIGN PATENT DOCUMENTS

JP 09-298195 11/1997

OTHER PUBLICATIONS

Sorab K. Ghandi; "VLSI Fabrication Principles, Silicon and Gallium Arsenide"; Copyright 1994 John Wiley & Sons; pp. 622–624.

* cited by examiner

Primary Examiner—Richard Elms
Assistant Examiner—Christian D. Wilson
(74) Attorney, Agent, or Firm—Volentine Francos, PLLC

(57) ABSTRACT

A shielding layer 23 is selectively formed on a single crystal silicon layer, an active area 25 is formed in the single crystal silicon layer by using the shielding layer 23 as a mask and an impurity layer 26 is formed at the edges at the sides of the active area 25 by using the shielding layer 23 as a mask and implanting an impurity diagonally from above. As a result, since an impurity layer can be formed by implanting ions of the impurity at the edges at the sides of the active area even when the size of the active area is reduced to the absolute limit, the occurrence of the parasitic transistor phenomenon or the edge transistor phenomenon along the edges at the sides of the active area can be prevented.

12 Claims, 12 Drawing Sheets

METHOD OF MANUFACTURING CMOS DEVICE WITH IMPLANTATION SHIELDING LAYER

BACKGROUND OF THE INVENTION

1. Field of the Invention

The present invention relates to a semiconductor device manufacturing method.

2. Description of the Related Art

Semiconductor devices such as CMOS's are normally manufactured by utilizing the SOI (silicon-on-insulator) substrate technology in the prior art.

FIGS. 2(a)–2(e) are sectional views of steps taken in a manufacturing method for manufacturing semiconductor devices that adopts the SOI substrate technology in the prior art.

First, a single crystal silicon layer 13 is formed on an embedded silicon oxide film 12 formed on a silicon substrate 11. Then, a thermal oxide film 14 is formed at the surface of the single crystal silicon layer 13. Next, a silicon nitride film is formed on the thermal oxide film 14. Subsequently, the silicon nitride film is selectively removed in a dry etching process implemented through photolithography so that a silicon nitride film 15 is left over an area which is to form an active area to be detailed later, as shown in FIG. 2(a).

Next, with the silicon nitride film 15 used as a mask, the single crystal silicon layer 13 undergoes selective thermal oxidation so as to form an oxide film 16 and an active area 17 as shown in FIG. 2(b). The active area 17 is an area over which an nMOS transistor or a pMOS transistor is to be formed. Then, as illustrated in FIG. 2(c), the silicon nitride film 15 is removed.

Next, a photoresist film is formed over the entire surface. The photoresist film is then selectively removed in an etching process implemented through photolithography and, as a result, only a photoresist layer 18 is left unremoved over the active area 17, as illustrated in FIG. 2(d). The position and the dimensions of the photoresist layer 18 are adjusted so as to ensure that it does not cover the edges at the sides of the active area 17. Then, by using the photoresist layer 18 as a mask, ions of an impurity are implanted at the edges at the sides of the active area 17 to form an impurity layer 19.

Next, the photoresist layer 18 is removed, and then ions of an impurity are implanted over the entire active area 17 to adjust the threshold value. In the following step, after forming a gate oxide film 20 and a gate polysilicon film 21 as illustrated in FIG. 2(e), a gate is formed by patterning the gate polysilicon film 21.

As a result, an nMOS transistor or a pMOS transistor is formed.

As described above, the impurity layer 19 is formed by implanting ions of an impurity at the edges at the sides of the active area 17 in the semiconductor device manufacturing method in the prior art. Thus, the parasitic transistor phenomenon and the edge transistor phenomenon are prevented from occurring along the edges at the sides of the active area 17, and the method is therefore free of problems such as reduced threshold voltage and hump characteristics.

However, the dimensions of the photoresist layer 18 used as a mask during the process of implanting ions of the impurity at the edges at the sides of the active area 17 must be set smaller than the dimensions of the active area 17 when forming an extremely small active area 17 to achieve miniaturization of the semiconductor device in the semiconductor device manufacturing method in the prior art.

The silicon nitride film 15 and the photoresist layer 18 used as masks when forming the active area 17 are patterned in an etching process implemented through photolithography. If the active area 17 is formed in the smallest possible size that allows a photolithography process to be implemented, it is not possible to pattern the photoresist layer 18, the dimensions of which are smaller than the dimensions of the active area 17. As a result, the impurity layer 19 cannot be formed by implanting ions of the impurity at the edges at the sides of the active area 17. Consequently, the occurrence of the parasitic transistor phenomenon or the edge transistor phenomenon along the edges at the sides of the active area 17 cannot be prevented and problems such as reduced threshold voltage and hump characteristics arise.

SUMMARY OF THE INVENTION

An object of the present invention is to provide a semiconductor device manufacturing method through which an impurity layer can be formed by implanting ions of an impurity at the edges at the sides of an active area formed in the smallest possible size, the occurrence of the parasitic transistor phenomenon or the edge transistor phenomenon along the edges of the sides of the active area can be prevented and problems such as reduced threshold voltage and hump characteristics can be prevented by addressing the problem discussed above.

Accordingly, in a semiconductor device manufacturing method according to the present invention, a shielding layer is selectively formed on a single crystal silicon layer, an active area is formed in the single crystal silicon layer by using the shielding layer as a mask and an impurity layer is formed at the edges at the sides of the active area by using the shielding layer as a mask and implanting an impurity diagonally from above.

In another semiconductor device manufacturing method according to the present invention, a first shielding layer is selectively formed on a single crystal silicon layer, an active area is formed in the single crystal silicon layer by using the first shielding layer as a mask, the first shielding layer is removed, a second shielding layer is selectively formed on the active area, the size of which is reduced and an impurity layer is formed at the edges at the sides of the active area by implanting an impurity with the reduced second shielding layer used as a mask.

In yet another semiconductor device manufacturing method according to the present invention, a shielding layer is selectively formed on a single crystal silicon layer, an active area is formed in the single crystal silicon layer by using the shielding layer as a mask, an impurity-containing layer which is in contact with the sides of the active area formed and an impurity layer is formed at the edges at the sides of the active area by diffusing the impurity from the impurity-containing layer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

The following is a detailed explanation of embodiments of the present invention, given in reference to the drawings.

In the embodiments, a semiconductor device such as a CMOS is manufactured by adopting, for instance, the SOI (silicon-on-insulator) substrate technology.

FIGS. 1(a) through 1(h) present sectional view of steps taken in the semiconductor device manufacturing method in a first embodiment of the present invention.

Figure 1A:
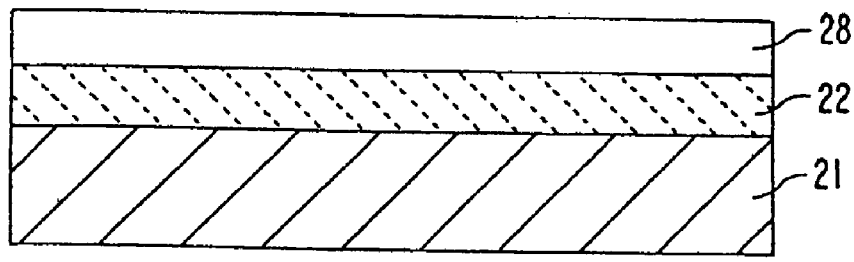
FIGS. 1(a)–1(h) present sectional view of steps taken in the semiconductor device manufacturing method in a first embodiment of the present invention.
Figure 1B:
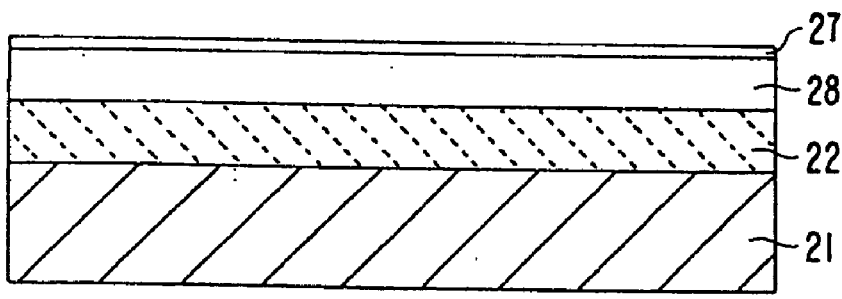
Figure 1C:
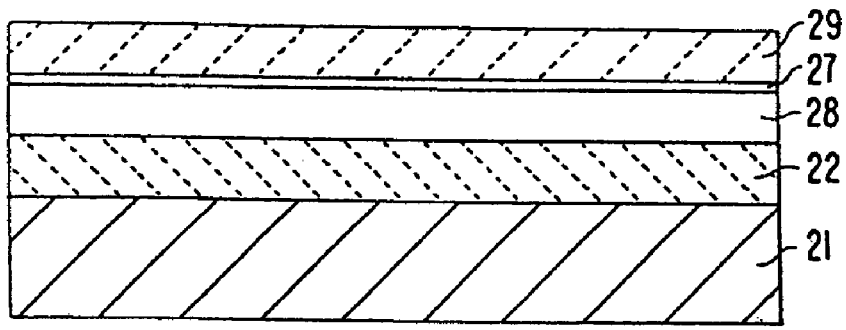
Figure 1D:
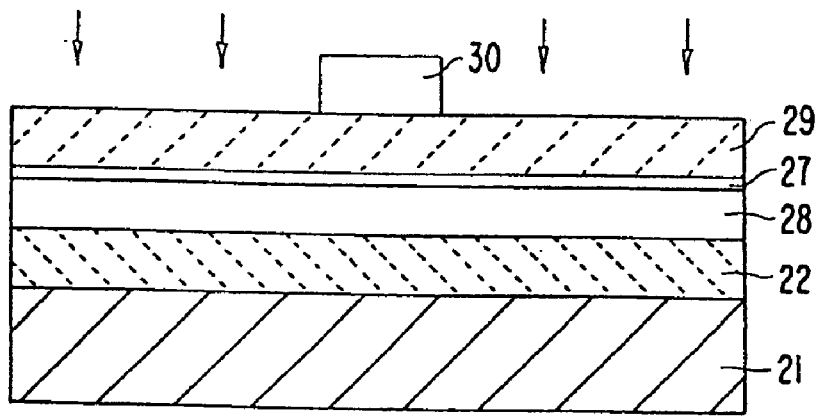
Figure 1E:
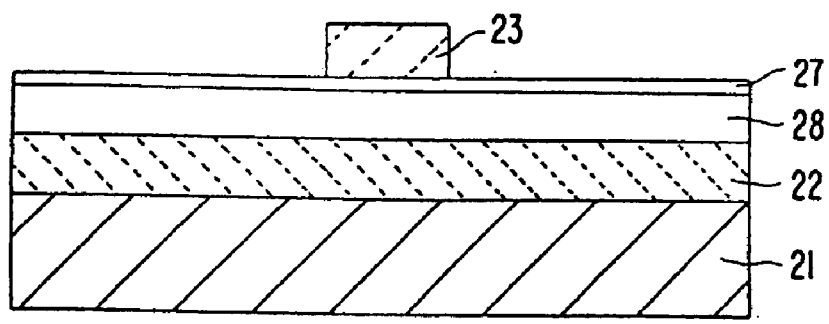

In this embodiment, a single crystal silicon layer 28 is formed on an embedded silicon oxide film 22, that is formed on a silicon substrate 21, as shown in FIG. 1(a). Then, a thermal oxide film 27 is formed at the surface of the single crystal silicon layer, as shown in FIG. 1(b). In the following step, and after forming a silicon nitride film 29 on the thermal oxide film, as shown in FIG. 1(c), the silicon nitride film is selectively removed in a dry etching process implemented through photolithography using a photoresist mask 30 as shown in FIG. 1(d). This leaves a silicon nitride film 23 as illustrated in FIG. 1(e) to constitute a shielding layer over an area that is to form an active area detailed later.

Figure 1F:
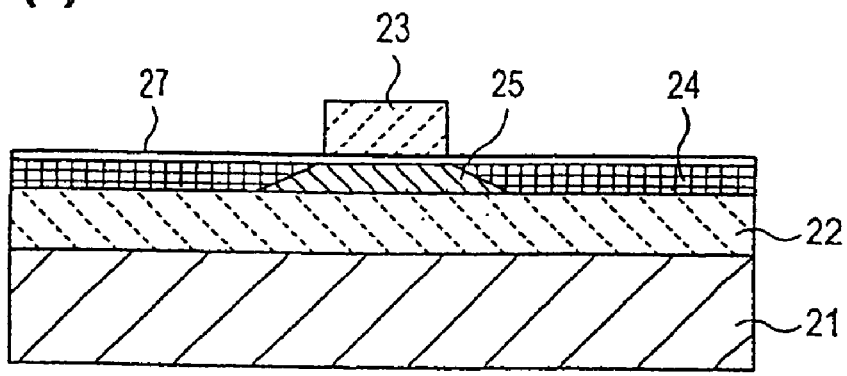

Next, with the silicon nitride film 23 used as a mask, the single crystal silicon layer 28 undergoes a selective thermal oxidation process, so that an oxide film 24 and an active area 25 are formed as shown in FIG. 1(f). The active area 25 is an area in which an nMOS transistor or a pMOS transistor is to be formed. As can be seen in FIG. 1(f), the active area is a mesa of the single crystal silicon.

Figure 1G:
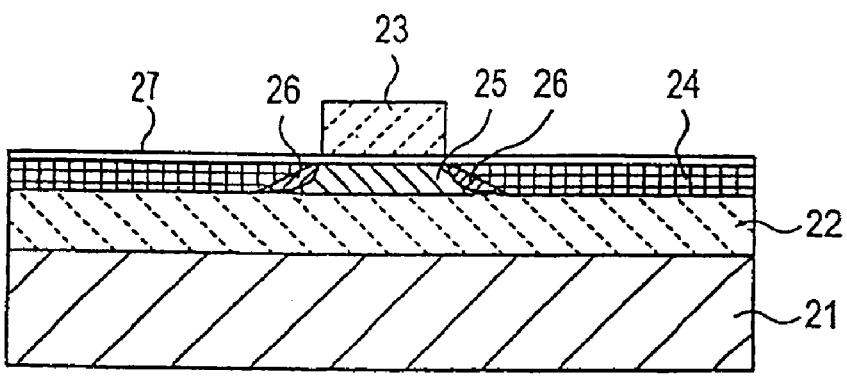

Then, an ion beam is irradiated diagonally from above while rotating the silicon substrate to implant ions of an impurity by using the silicon nitride film 23 as a mask. Since the ion beam is irradiated diagonally from above in the process, ions of the impurity are implanted at the edges of the active area 25 located directly under the silicon nitride film 23, to form an impurity layer 26 as illustrated in FIG. 1(g).

Since the silicon nitride film 23 is used as a mask, the required level of the ion implantation energy is determined in conformance with the type of impurity and the thickness of the silicon nitride film 23. For instance, if the impurity is $BF_2$ and the thickness of the silicon nitride film 23 is 100 (nm), ion implantation energy at approximately 50 (KeV) is required. If the impurity is P, the required level of ion implantation energy is approximately 40 (KeV).

Figure 1H:
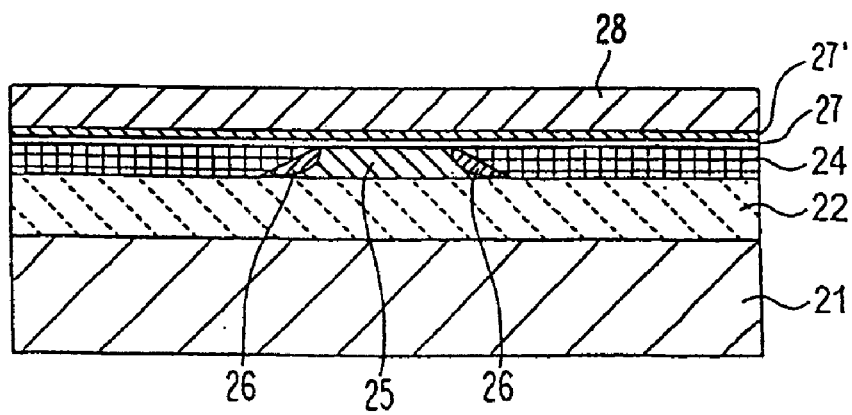
Figure 2A:
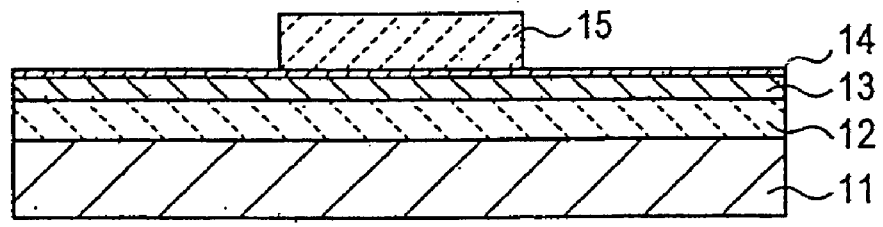
FIG. 2 presents sectional views of steps taken in a semiconductor device manufacturing method achieved by adopting the SOI substrate technology of the prior art.
Figure 2B:
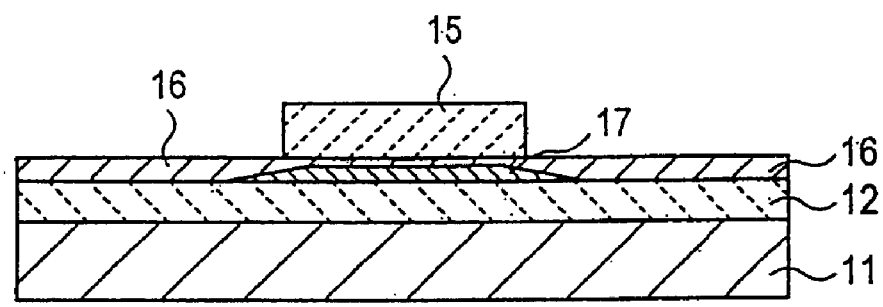
Figure 2C:
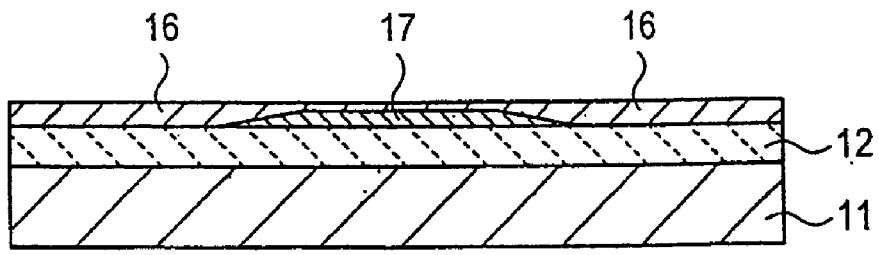
Figure 2D:
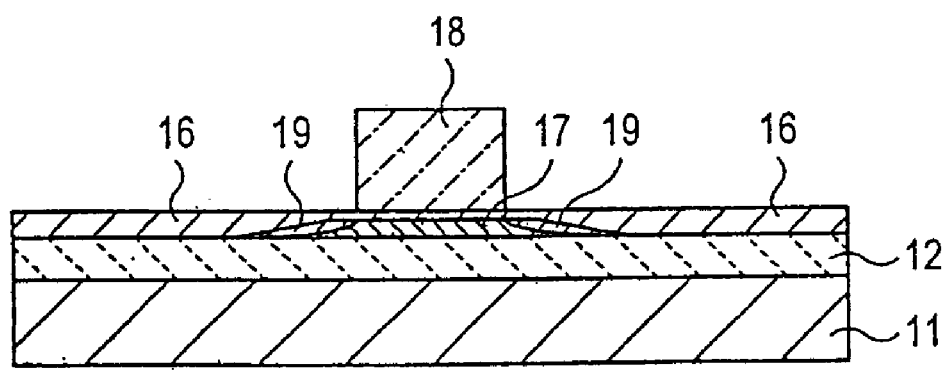
Figure 2E:
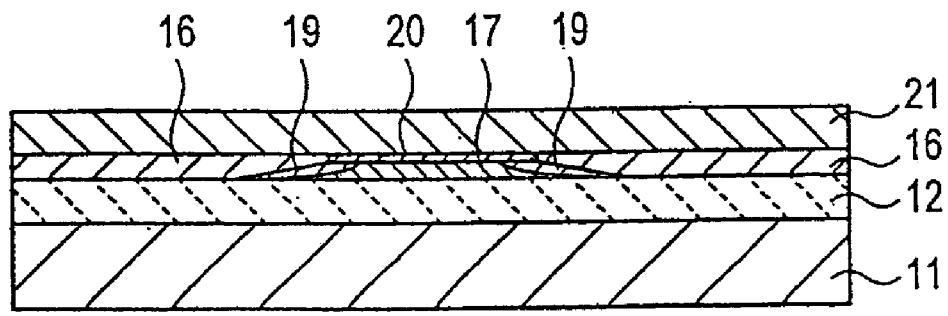

Next, the silicon nitride film 23 is removed and ions of an impurity are implanted over the entire active area 25 in order to adjust the threshold value (the threshold: $V_{TH}$). Then, as illustrated in FIG. 1(h), after forming a gate oxide film 27' and a gate polysilicon film 28, a gate (not shown) is formed by patterning the gate polysilicon film 28.

As a result, an nMOS transistor or a pMOS transistor is formed.

As described above, ions of the impurity are implanted at the edges at the sides of the active area by using as a mask the silicon nitride film which is also utilized as a mask in the formation of the active area in the embodiment. Consequently, even if the size of the active area is reduced to the smallest limit, it is possible to form an impurity layer by implanting ions of an impurity at the edges at the sides of the active area. Thus, the occurrence of the parasitic transistor phenomenon or the edge transistor phenomenon along the edges at the sides of the active area is prevented, thereby making it possible to manufacture a semiconductor device that is free of problems such as reduced threshold value and hump characteristics.

Next, the second embodiment of the present invention is explained.

It is to be noted that a repeated explanation of structural features and procedural steps identical to those in the first embodiment is omitted.

FIGS. 3(a)–3(d) present sectional views of steps taken in the semiconductor device manufacturing method in the second embodiment of the present invention.

In this embodiment, a single crystal silicon layer is first formed on an embedded silicon oxide film 22 formed on a silicon substrate 21. Then, a thermal oxide film is formed at the surface of the single crystal silicon layer. In the following step, after forming a silicon nitride film on the thermal oxide film, the silicon nitride film is selectively removed in a dry etching process implemented through photolithography to leave a silicon nitride film to constitute a first shielding layer over an area that is to form an active area to be detailed later.

Next, with the silicon nitride film 23 used as a mask, the single crystal silicon layer undergoes a selective thermal oxidation process, so that an oxide film 32 and an active area 33 are formed, and then the silicon nitride film is removed.

Figure 3A:
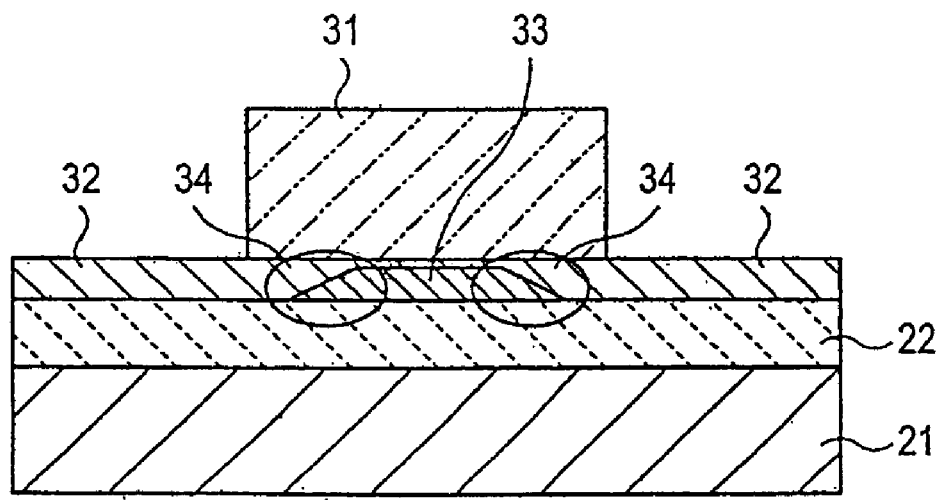
FIG. 3 presents sectional views of steps taken in the semiconductor device manufacturing method in a second embodiment of the present invention.

Next, after forming a photoresist film over the entire surface, the photoresist film is selectively removed in an etching process implemented through photolithography so that a photoresist 31 constituting a second shielding layer is left on the active area 33 as illustrated in FIG. 3(a). During this process, the photoresist 31 may be allowed to cover and conceal the edges 34 at the sides of the active area 33.

Figure 3B:
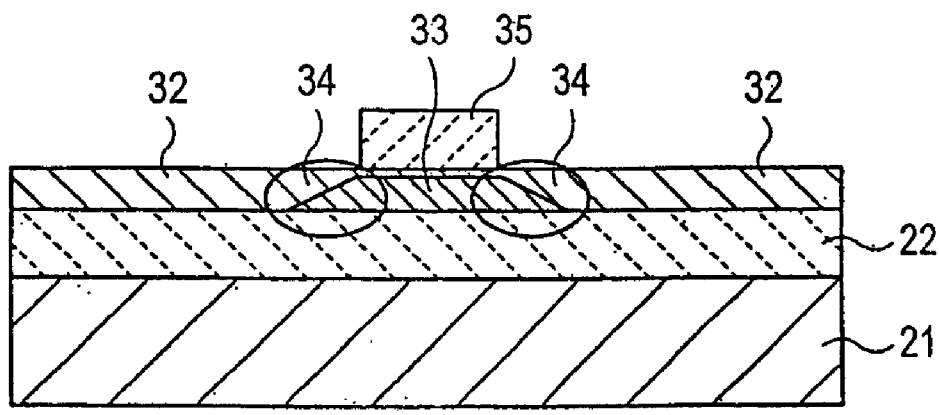

Next, isotropic etching is implemented on the photoresist 31 through $O_2$ plasma etching to reduce the size of the photoresist 31 until it does not cover and conceal the edges 34 at the sides of the active area 33 with a very small quantity of photoresist 35 allowed to remain unetched, as shown in FIG. 3(b).

Figure 3C:
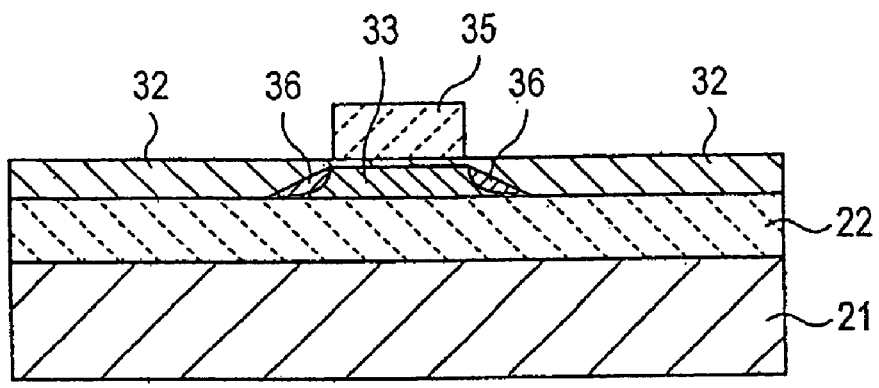

Then, by using the photoresist 35 remaining over a very small area as a mask, ions of an impurity are implanted at the edges 34 at the sides of the active area 33, to form an impurity layer 36 as shown in FIG. 3(c).

Figure 3D:
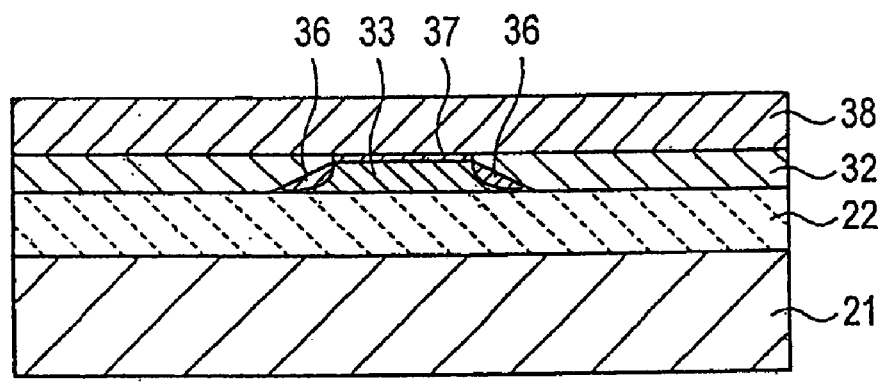

In the following step, the photoresist 35 remaining over the very small area is removed and ions of an impurity are implanted over the entire active area 33 to adjust the threshold value. Then, as illustrated in FIG. 3(d), after forming a gate oxide film 37 and a gate polysilicon film 38, a gate is formed by patterning the gate polysilicon film 38.

As a result, an nMOS transistor or a pMOS transistor is formed.

As explained above, miniaturization is achieved to a degree that is beyond the limit that allows adoption of the photolithography method by reducing the dimensions of the photoresist used as a mask in the impurity ion implantation process through $O_2$ plasma etching in the embodiment. Thus, even if the size of the active area is reduced to the limit, an impurity layer can be formed by implanting ions of an impurity at the edges at the sides of the active area. As a result, the occurrence of the parasitic transistor phenomenon or the edge transistor phenomenon along the edges at the sides of the active area can be prevented, to make it possible to manufacture a semiconductor device free of problems such as reduced threshold value and hump characteristics.

Next, the third embodiment of the present invention is explained.

It is to be noted that a repeated explanation of structural features and procedural steps identical to those in the first and second embodiments is omitted.

Figure 4A:
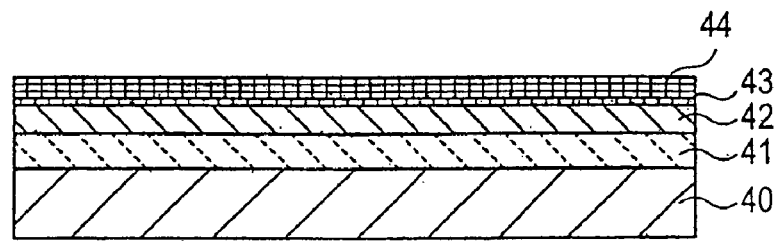
FIG. 4 presents sectional views of steps (part 1) taken in the semiconductor device manufacturing method in a third embodiment of the present invention.
Figure 4B:
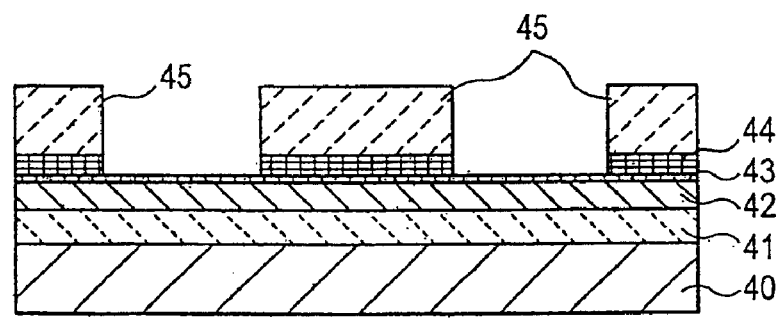
Figure 4C:
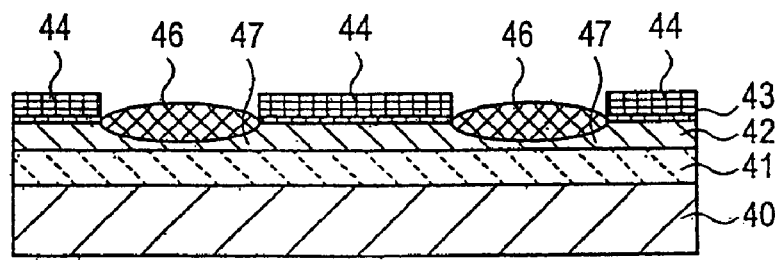
Figure 5A:
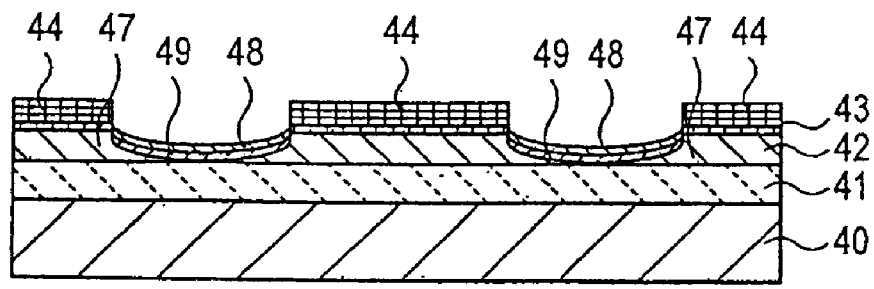
FIG. 5 presents sectional views of steps (part 2) taken in the semiconductor device manufacturing method in the third embodiment of the present invention.
Figure 5B:
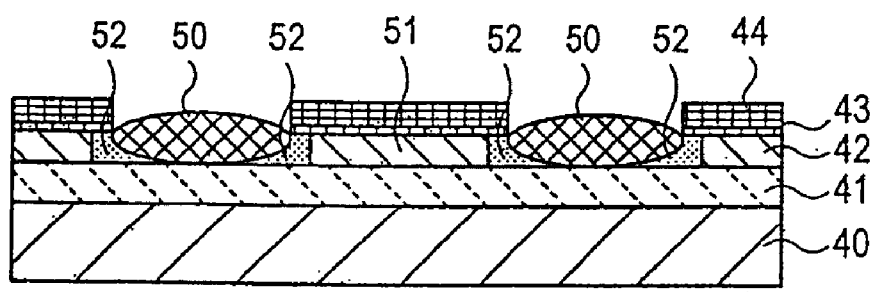
Figure 5C:
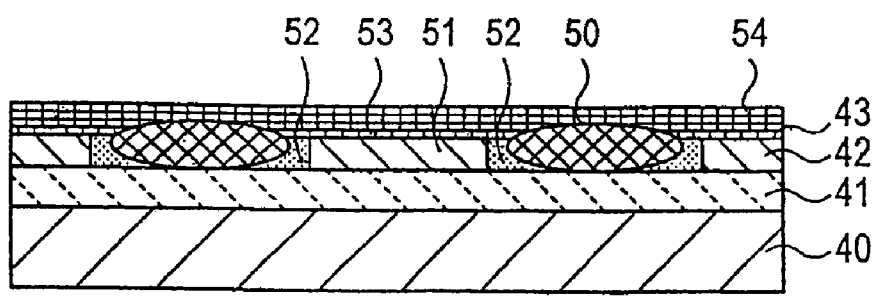

FIGS. 4(a)–4(c) present sectional views of steps taken in the semiconductor device manufacturing method (part 1) in the third embodiment of the present invention and FIGS. 5(a)–5(c) present sectional views of steps taken in the semiconductor device manufacturing method (part 2) in the third embodiment of the present invention.

In this embodiment, a single crystal silicon layer 42 is first formed on an embedded silicon oxide film 41 formed on a silicon substrate 40. Then, a thermal oxide film 43 is formed at the surface of the single crystal silicon layer 42. Next, a silicon nitride film 44 is formed on the thermal oxide film 43, as illustrated in FIG. 4(a).

In the following step, after forming a photoresist film on the silicon nitride film 44, the photoresist film is patterned through photolithography. Then, the silicon nitride film 44 is selectively removed in a dry etching process implemented by using the remaining photoresist 45 as a mask, as illustrated in FIG. 4(b).

Next, after removing the photoresist 45, the single crystal silicon layer 42 undergoes a selective thermal oxidation process by using the silicon nitride film 44 as a mask, to form a thermal oxide film 46 as illustrated in FIG. 4(c). It is to be noted that during this process, the length of the thermal oxidation process, the flow rate ratio of the flow rates of the individual gases in the oxidizing gas and the like should be adjusted to ensure that the entire single crystal silicon layer 42 does not become thermally oxidized and that a single crystal silicon layer 47 is allowed to remain under the thermal oxide film 46.

Figure 4D:
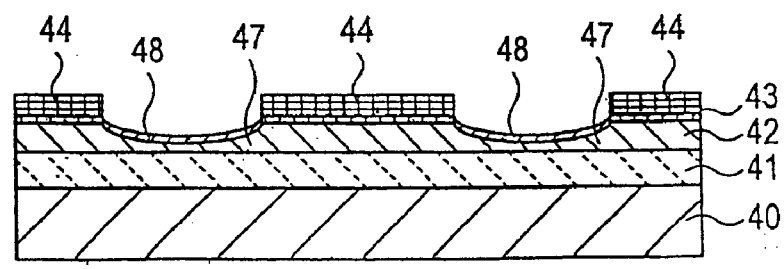

In the following step, the thermal oxide film 46 is removed through wet etching or dry etching and then, as illustrated in FIG. 4(d), an oxide film 48 is formed at the surfaces of the single crystal silicon layers 47. The oxide films 48 may be formed by thermally oxidizing the 47 or through a CVD method.

Next, ions of an impurity are implanted into the single crystal silicon layer 47 through the oxide film 48 by using the silicon nitride film 44 as a mask, to form an impurity layer 49 constituted of an impurity-containing layer as illustrated in FIG. 5(a).

Then, a thermal oxide film 50 is formed by implementing selective thermal oxidation on the single crystal silicon layer 47 with the silicon nitride film 44 as a mask, to form an active area 51 as shown in FIG. 5(b). It is to be noted that the presence of the oxide films 48 at the surface of the impurity layer 49 prevents the impurity within the impurity layer 49 from becoming diffused to the outside and instead, the impurity is diffused into the active area 51. As a result, an impurity layer 52 is formed at the edges at the sides of the active area 51.

In the following step, the silicon nitride film 44 remaining is removed and ions of an impurity are implanted over the entire active area 51 to adjust the threshold value. Then, as illustrated in FIG. 5(c), after forming a gate oxide film 53 and a gate polysilicon film 54, a gate is formed by patterning the gate polysilicon film 54.

As a result, an nMOS transistor or a pMOS transistor is formed.

As described above, in the embodiment in which ions of an impurity are first implanted outside the active area and then the impurity is diffused into the active area, it is possible to form impurity layers at the edges at the sides of the active area even when the size of the active area is reduced to the limit. Thus, the occurrence of the parasitic transistor phenomenon or the edge transistor phenomenon along the edges at the sides of the active area can be prevented, making it possible to manufacture a semiconductor device free of problems such as reduced threshold value and hump characteristics.

Next, the fourth embodiment of the present invention is explained.

It is to be noted that a repeated explanation of structural features and procedural steps identical to those in the first–third embodiments is omitted.

FIGS. 6(a)–6(d) present sectional views of steps taken in the semiconductor device manufacturing method (part 1) in the fourth embodiment of the present invention and FIGS. 7(a)–7(d) present sectional views of steps taken in the semiconductor device manufacturing method (part 2) in the fourth embodiment of the present invention.

Figure 6A:
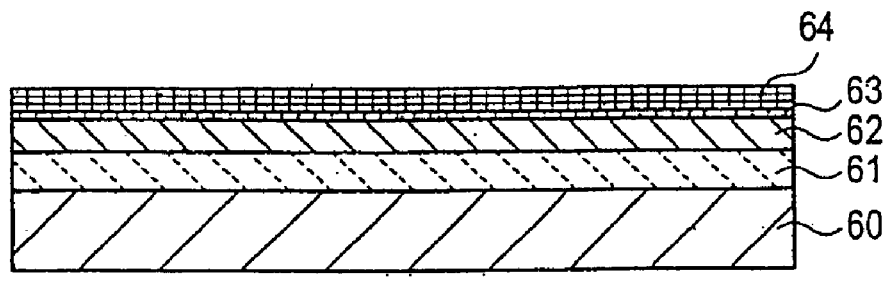
FIG. 6 presents sectional views of steps (part 1) taken in the semiconductor device manufacturing method in a fourth embodiment of the present invention.

In this embodiment, a single crystal silicon layer 62 is first formed on an embedded silicon oxide film 61 formed a silicon substrate 60. Then, a thermal oxide film 63 is formed at the surface of the single crystal silicon layer 62. Next, a silicon nitride film 64 is formed on the thermal oxide film 63, as illustrated in FIG. 6(a).

Figure 6B:
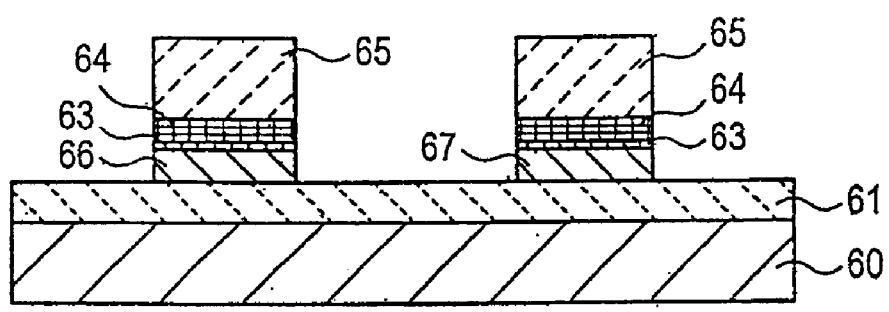

In the following step, after forming a photoresist film on the silicon nitride film 64, the photoresist film is patterned through photolithography. Then, the silicon nitride film 64, the thermal oxide film 63 and the single crystal silicon layer 62 are selectively removed in a dry etching process implemented by using the remaining photoresist 65 as a mask. As a result, as illustrated in FIG. 6(b), an nMOS transistor formation area 66 and a pMOS transistor formation area 67 each constituting an active area are formed.

Figure 6C:
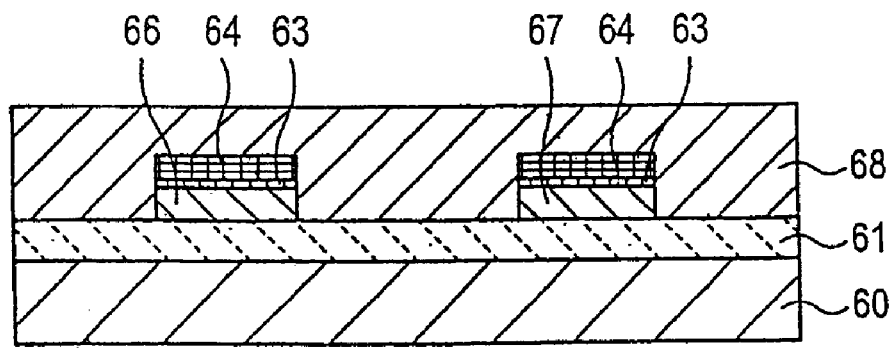

Then, after removing the photoresist 65, a silicon oxide film 68 constituting an impurity-containing layer achieved by implanting B is formed over the entire surface through the CVD method, as illustrated in FIG. 6(c).

Figure 6D:
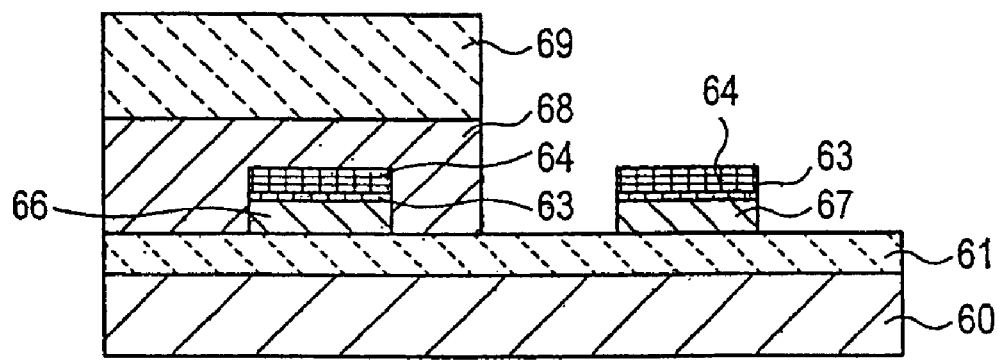

Next, after forming a photoresist film along the silicon oxide film 68, the photoresist film is patterned through photolithography. In the following step, in a dry etching process implemented by using the remaining photoresist 69 as a mask, the silicon oxide film 68 formed on the pMOS transistor formation area 67 is selectively removed as illustrated in FIG. 6(d). As a result, the silicon oxide film 68 constituting an impurity-containing layer achieved by implanting B is selectively formed.

Figure 7A:
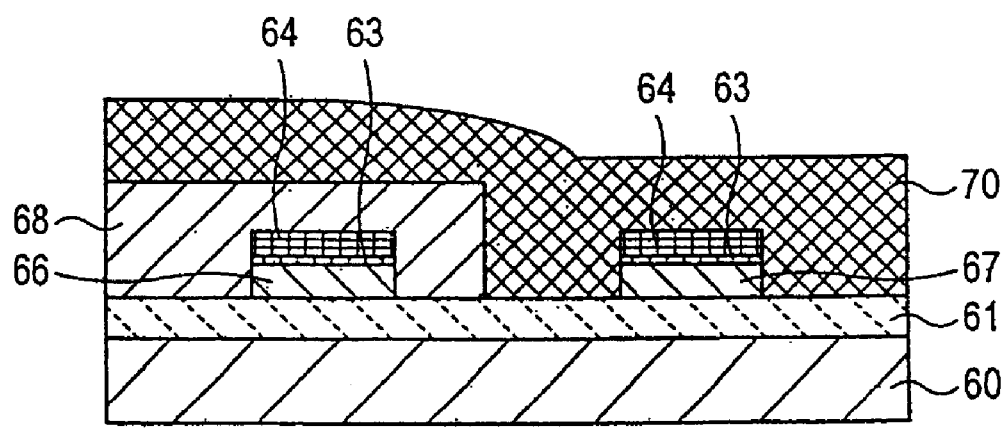
FIG. 7 presents sectional views of steps (part 2) taken in the semiconductor device manufacturing method in the fourth embodiment of the present invention.

Next, after removing the photoresist 69, a silicon oxide film 70 constituting an impurity-containing layer achieved by implanting P is formed over the entire surface through a CVD method, as illustrated in FIG. 7(a).

Figure 7B:
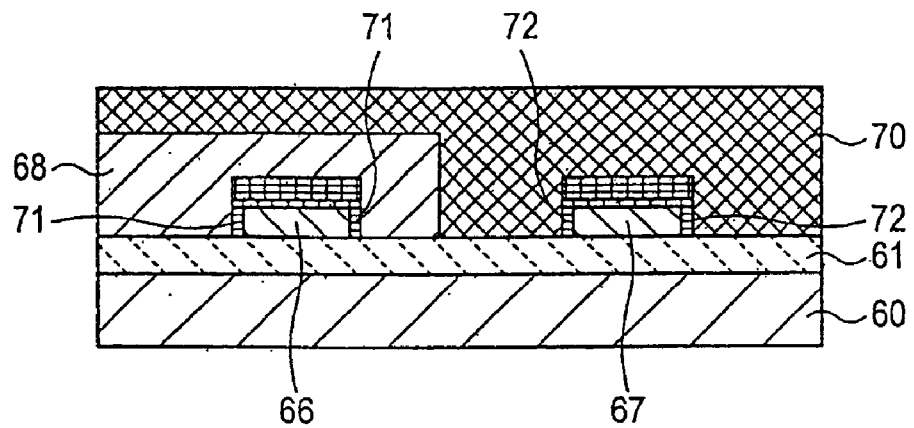

Then, annealing is performed at approximately 1000° C. within an inert gas atmosphere to flatten the surface of the silicon oxide film 70 by causing it to reflow, as illustrated in FIG. 7(b). At this time, since the impurity B in the silicon oxide film 68 is diffused into the nMOS transistor formation area 66 from lateral direction, an impurity layer 71 is formed at the edges at the sides of the nMOS transistor formation area 66. The impurity P in the silicon oxide film 70, on the other hand, is diffused into the pMOS transistor formation area 67 from the lateral direction, thereby forming impurity layers 72 at the edges at the sides of the pMOS*[1] transistor formation area 67.

Figure 7C:
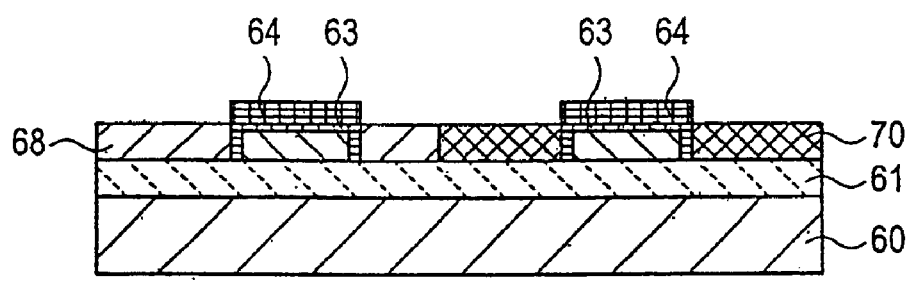

Next, the silicon oxide films 68 and 70 are etched back in an anisotropic dry etching process to expose the silicon nitride film 64, as illustrated in FIG. 7(c).

Figure 7D:
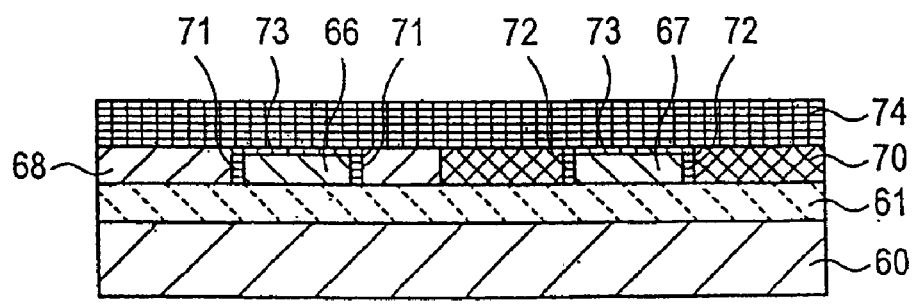

In the following step, the silicon nitride film 64 is removed, and after forming a gate oxide film 73 and a gate polysilicon film 74 as illustrated in FIG. 7(d), the gate polysilicon film 74*[2] is patterned to form gates.

As a result, an nMOS transistor and a pMOS transistor are formed.

As described above, after forming silicon oxide films each achieved by implanting an impurity on the outside of the nMOS transistor formation area and the pMOS transistor formation area constituting active areas, the impurities are diffused into the nMOS transistor formation area and the pMOS transistor formation area in the embodiment. Thus, it is possible to form impurity layers at the edges at the sides of the nMOS transistor formation area and the pMOS transistor formation area even when the sizes of the nMOS transistor formation area and the pMOS transistor formation area are reduced to the limit. As a result, the occurrence of the parasitic transistor phenomenon or the edge transistor phenomenon along the edges at the sides of the active areas can be prevented, making it possible to manufacture a semiconductor device free of problems such as a reduced threshold value and hump characteristics.

While an explanation is given above in reference to the first~fourth embodiments in which a semiconductor device such as a CMOS is manufactured through the SOI substrate technology, the present invention may be adopted to manufacture, for instance, a semiconductor device such as a memory cell of a DRAM on a normal silicon substrate (bulk substrate). In such a case, since the occurrence of the parasitic transistor phenomenon or the edge transistor phenomenon along the edges at the sides of an active area can be prevented, a semiconductor device free of problems such as reduced threshold value and hump characteristics is manufactured.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

As has been explained in detail above, in a semiconductor device manufacturing method according to the present invention, a shielding layer is selectively formed on a single crystal silicon layer, an active area is formed inside the single crystal silicon layer by using the shielding layer as a mask an impurity layer is formed at the edges at the sides of the active area by using the shielding layer as a mask and implanting an impurity diagonally from above.

Since an impurity layer can be formed at the edges at the sides of the active area by implanting ions of an impurity even when the size of the active area is reduced to the absolute limit through this method, the occurrence of the parasitic transistor phenomenon or the edge transistor phenomenon along the edges at the sides of the active area can be prevented. As a result, a semiconductor device free of problems such as a reduced threshold value and hump characteristics is manufactured.

In another semiconductor device manufacturing method according to the present invention, a first shielding layer is selectively formed on a single crystal silicon layer, an active area is formed within the single crystal silicon layer by using the first shielding layer as a mask, the first shielding layer is removed, a second shielding layer is selectively formed on the active area, the size of the second shielding layer is reduced and an impurity layer is formed at the edges at the sides of the active area by implanting an impurity with the reduced second shielding layer used as a mask.

Since an impurity layer can be formed at the edges at the sides of the active area by implanting ions of an impurity even when the size of the active area is reduced to the absolute limit by adopting this method, the occurrence of the parasitic transistor phenomenon or the edge transistor phenomenon along the edges at the sides of the active area can be prevented. As a result, a semiconductor device free of problems such as a reduced threshold value and hump characteristics is manufactured.

In yet another semiconductor device manufacturing method according to the present invention, a shielding layer is selectively formed on a single crystal silicon layer, an active area is formed inside the single crystal silicon layer by using the shielding layer as a mask, an impurity-containing layer that comes in contact with the sides of the active area is formed and an impurity layer is formed at the edges at the sides of the active area by diffusing the impurity from the impurity-containing layer.

Since an impurity layer can be formed at the edges at the sides of the active area by implanting ions of an impurity even when the size of the active area is reduced to the absolute limit by adopting this method, the occurrence of the parasitic transistor phenomenon or the edge transistor phenomenon along the edges at the sides of the active area can be prevented. As a result, a semiconductor device free of problems such as reduced threshold value and hump characteristics is manufactured.

What is claimed is:

1. A semiconductor device manufacturing method comprising:
    forming a shielding layer over a portion of a single crystal silicon layer;
    thermally oxidizing said single crystal silicon layer into an oxide film using said shielding layer as a mask, so that an active area of said single crystal silicon layer remains under said shielding area, said active area having sloped sidewalls that extend laterally and that are not under said shielding layer;
    diagonally implanting impurities from above into said sloped sidewalls to form impurity layers in said active area, using said shielding layer as a mask;
    removing said shielding layer; and
    implanting impurities into said active area to adjust a threshold voltage of the semiconductor device, after said removing.

2. A semiconductor device manufacturing method according to claim 1, wherein said shielding layer is a silicon nitride film.

3. A semiconductor device manufacturing method according to claim 1, wherein said diagonally implanting comprises implanting impurities using said shielding layer as a mask while rotating the semiconductor device.

4. A semiconductor device manufacturing method according to claim 1, wherein the impurities are not implanted into said active area under said shielding layer during said diagonally implanting impurities.

5. A semiconductor device manufacturing method comprising:

forming a first shielding layer over a portion of a single crystal silicon layer;

thermally oxidizing said single crystal silicon layer into an oxide film using said first shielding layer as a mask, so that an active area of said single crystal silicon layer remains under said first shielding layer, said active area having sloped sidewalls that extend laterally;

removing said first shielding layer;

forming a second shielding layer over said active area;

reducing a width of said second shielding layer so that said sloped sidewalls are not under said reduced second shielding layer; and implanting impurities into said sloped sidewalls to form impurity areas in said active area, using said reduced second shielding layer as a mask.

6. A semiconductor device manufacturing method according to claim 5, wherein said first shielding layer is a silicon nitride film.

7. A semiconductor device manufacturing method according to claim 5, wherein said second shielding layer is a photoresist.

8. A semiconductor device manufacturing method according to claim 5, wherein said reducing comprises isotropically etching said second shielding layer with $O_2$ plasma.

9. A semiconductor device manufacturing method according to claim 5, wherein said forming a second shielding layer comprises photolithography.

10. A semiconductor device manufacturing method comprising:

forming a shielding layer on a single crystal silicon layer;

forming an active area in said single crystal silicon layer using said shielding layer as a mask;

forming an impurity-containing layer in contact with sides of said active area by implanting impurities through an oxide layer formed on surfaces of said single crystal silicon layer adjacent said active area;

forming an impurity layer in said sides of said active area by diffusing the impurities from said impurity-containing layer into said sides of said active area;

removing said shielding layer; and adjusting a threshold voltage of the semiconductor device by implanting impurities into said active area after said removing.

11. A semiconductor device manufacturing method according to claim 10, wherein said shielding layer is a silicon nitride film.

12. A semiconductor device manufacturing method according to claim 10, wherein said impurity-containing layer in contact with said sides of said active area is selectively formed.

* * * * *